US012796005B2

(12) United States Patent
Park et al.

(10) Patent No.: US 12,796,005 B2
(45) Date of Patent: Nov. 10, 2026

(54) THREE-DIMENSIONAL STACKED FIELD EFFECT TRANSISTOR

(71) Applicant: Samsung Electronics Co., Ltd., Suwon-si (KR)

(72) Inventors: Jisoo Park, Suwon-si (KR); Donghoon Hwang, Suwon-si (KR); Inchan Hwang, Suwon-si (KR); Hyojin Kim, Suwon-si (KR); Jaehyoung Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 334 days.

(21) Appl. No.: 18/510,146

(22) Filed: Nov. 15, 2023

(65) Prior Publication Data

US 2024/0258437 A1 Aug. 1, 2024

(30) Foreign Application Priority Data

Jan. 27, 2023 (KR) ........................ 10-2023-0011116

(51) Int. Cl.
*H10D 30/67* (2025.01)
*H10D 30/43* (2025.01)
*H10D 62/10* (2025.01)

(52) U.S. Cl.
CPC ......... *H10D 30/6757* (2025.01); *H10D 30/43* (2025.01); *H10D 30/6735* (2025.01); *H10D 62/121* (2025.01)

(58) Field of Classification Search
CPC ........... H10D 30/6757; H10D 30/6735; H10D 30/43; H10D 62/121

(Continued)

(56) References Cited

U.S. PATENT DOCUMENTS 11,063,045 B2 7/2021 Wu et al.
11,222,831 B2 1/2022 Do et al.

(Continued)

FOREIGN PATENT DOCUMENTS

CN 115513140 A 12/2022

OTHER PUBLICATIONS

Lai et al. CN 115513140 A, Integrated Circuit Device and Manufacturing Method Thereof, Published Dec. 23, 2022 (Year: 2022).*

(Continued)

*Primary Examiner* — Tu-Tu V Ho
(74) *Attorney, Agent, or Firm* — Harness, Dickey & Pierce, P.L.C.

(57) ABSTRACT

A 3D stacked FET may include a back-side wiring layer including a first back-side power line and a second back-side power line, a first FET on the back-side wiring layer, a second FET over the first FET, a front-side wiring layer over the second FET, a first through-electrode connecting the first FET to the second FET, and a second through-electrode connecting the front-side and back-side power lines. The front-side wiring layer may extend in a first direction and may include a front-side power line connected to the second back-side power line. The first FET and the second FET may share a gate extending in a second direction. Each of the first FET and the second FET may include a source and a drain respectively on both sides of the gate in the first direction, and a channel between the source and the drain and surrounded by the gate.

20 Claims, 15 Drawing Sheets

(58) Field of Classification Search
USPC .......................................................... 257/288
See application file for complete search history.

(56) References Cited

U.S. PATENT DOCUMENTS

| | | | |
|---|---|---|---|
| 2021/0366906 | A1 | 11/2021 | Huang et al. |
| 2022/0028895 | A1 | 1/2022 | Kim et al. |
| 2022/0122970 | A1 | 4/2022 | Do et al. |
| 2022/0123023 | A1 | 4/2022 | Peng et al. |
| 2022/0157804 | A1 | 5/2022 | Wang et al. |
| 2022/0181258 | A1 | 6/2022 | Liebmann et al. |
| 2022/0208757 | A1 | 6/2022 | Do et al. |
| 2022/0344481 | A1 | 10/2022 | Hong et al. |
| 2023/0067311 | A1 | 3/2023 | Lai et al. |

OTHER PUBLICATIONS

Extended European Search Report dated Mar. 7, 2024 for corresponding European Patent Application No. 23197091.4.

* cited by examiner

THREE-DIMENSIONAL STACKED FIELD EFFECT TRANSISTOR

CROSS-REFERENCE TO RELATED APPLICATION

This application is based on and claims priority under 35 U.S.C. § 119 to Korean Patent Application No. 10-2023-0011116, filed on Jan. 27, 2023 in the Korean Intellectual Property Office, the disclosure of which is incorporated by reference herein in its entirety.

BACKGROUND

Inventive concepts relate to a Field Effect Transistor (FET), and more particularly, to a three dimensional (3D) stacked FET having a structure in which FETs are stacked.

Recently, down-scaling of semiconductor devices has been rapidly progressing. In addition, since a semiconductor device may require not only high operating speed but also operational accuracy, the structure of a transistor included in the semiconductor device is being optimized. In particular, as semiconductor devices are highly integrated, semiconductor devices may have three-dimensional transistors having a multi-gate structure. For example, a 3D transistor may be implemented in a form in which a gate surrounds an active fin formed on a substrate.

SUMMARY

Inventive concepts provide a three dimensional (3D) stacked Field Effect Transistor (FET) capable of sufficiently securing a channel width without increasing a cell height.

In addition, inventive concepts are not limited to the above-mentioned aspects, and other aspects may be clearly understood by those skilled in the art from the description below.

According to an embodiment of inventive concepts, a three dimensional (3D) stacked Field Effect Transistor (FET) may include a back-side wiring layer including a first back-side power line and a second back-side power line each extending in a first direction; a first FET on the back-side wiring layer; a second FET over the first FET; a front-side wiring layer over the second FET, the front-side wiring layer extending in the first direction, and the front-side wiring layer including a front-side power line connected to the second back-side power line; a first through-electrode connecting the first FET to the second FET; and a second through-electrode connecting the front-side power line to the second aback-side power line. The first FET and the second FET may share a gate extending in a second direction. The second direction may be perpendicular to the first direction. Each of the first FET and the second FET may include a source and a drain respectively on both sides of the gate in the first direction, and a channel between the source and the drain and surrounded by the gate.

According to an embodiment of inventive concepts, a 3D stacked FET may include a back-side wiring layer including a first back-side power line and a second back-side power line each extending in a first direction; a first FET on the back-side wiring layer; a second FET over the first FET, a conductivity type of the second FET being different than a conductivity type of the first FET; a front-side wiring layer over the second FET, the front-side wiring layer extending in the first direction and including a front-side power line connected to the second back-side power line; a first through-electrode connecting the first FET to the second FET; and a second through-electrode connecting the front-side power line to the second back-side power line. The first FET and the second FET may share a first gate. The first FET and the second FET may be in a unit cell of the 3D stacked FET. The unit cell may correspond to an area between up to one-half of each of two other gates on opposite sides of the first gate in the first direction and between the first back-side power line and the second back-side power line in a second direction. In the unit cell, the first gate may be between the two other gates. The second direction may be perpendicular to the first direction. The unit cell may be among a plurality of unit cells repeatedly arranged in the first direction and the second direction.

According to an embodiment of inventive concepts, a 3D stacked FET may include a back-side wiring layer including a first back-side power line and a second back-side power line each extending in a first direction; a first FET on the back-side wiring layer; a second FET over the first FET, a conductivity type of the second FET being different than a conductivity type of the first FET; a front-side wiring layer over the second FET, the front-side wiring layer extending in the first direction, and the front-side wiring layer including a front-side power line connected to the second back-side power line; a first through-electrode connecting the first FET to the second FET; and a second through-electrode connecting the front-side power line to the second back-side power line. The first FET and the second FET may share a first gate. The first FET and the second FET may be in a unit cell of the 3D stacked FET. The unit cell may correspond to an area between up to one-half of each of two other gates on opposite sides of the first gate in the first direction and between the first back-side power line and the second back-side power line in a second direction. The second direction may be perpendicular to the first direction. In the unit cell, the first gate may be between the two other gates. Each of the first FET and the second FET may include a source and a drain respectively on both sides of the first gate in the first direction, and a channel between the source and the drain and surrounded by the first gate.

BRIEF DESCRIPTION OF THE DRAWINGS

Embodiments will be more clearly understood from the following detailed description taken in conjunction with the accompanying drawings in which.

DETAILED DESCRIPTION

Figure 1:
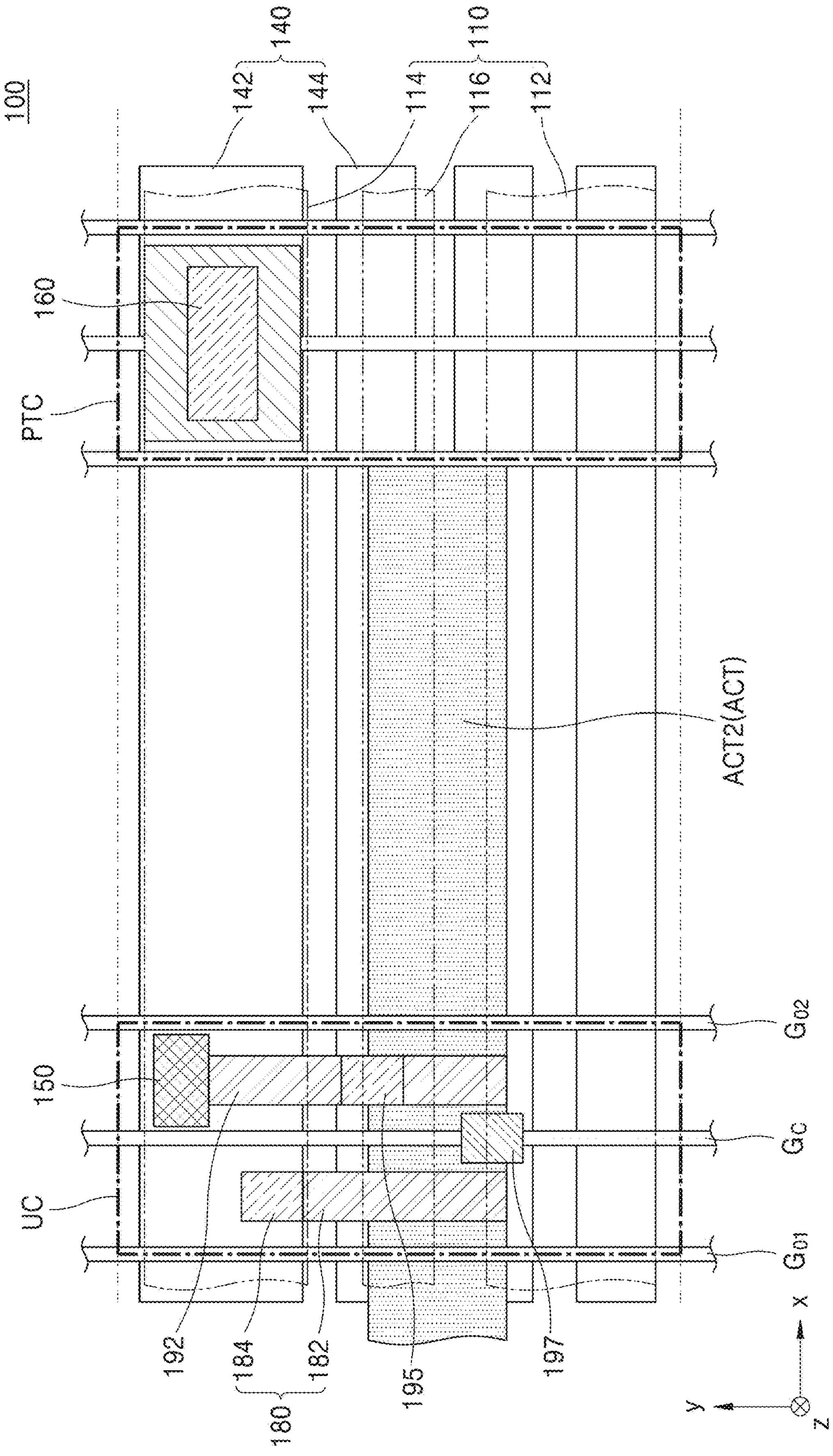
FIG. 1 is a plan view of a three dimensional (3D) stacked Field Effect Transistor (FET) according to an embodiment.

Embodiments of inventive concepts will be described in detail with reference to the accompanying drawings. The same reference numerals are used for the same components in the drawings, and duplicate descriptions thereof are omitted.

FIG. 1 is a plan view of a three dimensional (3D) stacked field effect transistor (FET) according to an embodiment.

Referring to FIG. 1, a 3D stacked FET 100 of this embodiment may include a back-side wiring layer 110, a first FET 120 (see FIG. 3A), a second FET 130 (see FIG. 3A), a front-side wiring layer 140, a first through electrode 150, and a second through electrode 160, which are disposed on a substrate. Here, the back-side may mean a lower side in the z direction and the front-side may mean an upper side in the z direction. For example, the back-side wiring layer 110, the first FET 120, the second FET 130, and the front-side wiring layer 140 may be sequentially disposed on the substrate in the z direction.

The back-side wiring layer 110 may include a first back-side power line 112, a second back-side power line 114, and a back-side signal line 116. The first back-side power line 112 may extend in the x direction. The first back-side power line 112 may provide first power VDD, e.g., power of a positive potential, to the first FET 120 and the second FET 130.

The second back-side power line 114 may be spaced apart from the first back-side power line 112 in the y direction and extend in the x direction. The second back-side power line 114 may provide second power VSS, e.g., power at a negative potential or a ground potential, to the first FET 120 and the second FET 130.

The back-side signal line 116 may be disposed between the first back-side power line 112 and the second back-side power line 114 in the y-direction and extend in the x-direction. The back-side signal line 116 may be connected to a first source/drain (see S1/D1 of FIG. 3A) of the first FET 120 through a contact. Signals may be input/output to/from the first FET 120 through the back-side signal line 116.

In the 3D stacked FET 100 of this embodiment, the first back-side power line 112 and the second back-side power line 114 may be alternately disposed with the back-side signal line 116 disposed in the y direction. As may be seen from FIG. 1, one first back-side power line 112, one back-side signal line 116, and one second back-side power line 114 may configure one cell in the y direction. The arrangement structure of the back-side wiring layer 110 in the y direction is described in more detail in the description of FIGS. 7A and 7B.

The first FET 120 may be disposed on the back-side wiring layer 110 in the z direction. Also, the second FET 130 may be disposed above the first FET 120 in the z direction. That is, the second FET 130 may be stacked on top of the first FET 120. As such, the 3D stacked FET 100 of this embodiment may have a structure in which two FETs are stacked in the z direction. The stacked structure of the first FET 120 and the second FET 130 is described in more detail in the description of FIGS. 2A to 3B.

In the 3D stacked FET 100 of this embodiment, the first FET 120 may be a PMOS FET and the second FET 130 may be an NMOS FET. However, in other embodiments, the first FET 120 may be an NMOS FET and the second FET 130 may be a PMOS FET. The first FET 120 and the second FET 130 may each include a gate Gc, a source/drain (see S1/D1 and S2/D2 in FIG. 3A), and a channel (see MBC1 and MBC2 in FIG. 3A).

Specifically, the first FET 120 may include a gate Gc, a first source/drain S1/D1, and a first channel MBC1 and the second FET 130 may include a gate Gc, second source/drain S2/D2, and a second channel MBC2. The first FET 120 and the second FET 130 may share the gate Gc.

The gate Gc may extend in the y direction. The gate Gc may surround the first channel MBC1 and the second channel MBC2 in a gate all around (GAA) structure. The active region ACT extends in the x direction and may include a lower first active region (refer to ACT1 in FIG. 3A) and an upper second active region ACT2. The first active region ACT1 may configure the first source/drain S1/D1 and the first channel MBC1, and the second active region ACT2 may configure the second source/drain S2/D2 and the second channel MBC2. The first active region ACT1 and the second active region ACT2 may be electrically separated by a dielectric film DL.

Specifically, in the first FET 120, the first active regions ACT1 on both sides of the gate Gc in the x direction may constitute the first source/drain S1/D1, and the first active region ACT1 between the first source S1 and the first drain D1 may constitute the first channel MBC1. In addition, in the second FET 130, the second active region ACT2 on both sides of the gate Gc in the x direction may constitute the second source/drain S2/D2, and the second active region ACT2 between the second source S2 and the second drain D2 may constitute the second channel MBC2. Furthermore, each of the first channel MBC1 and the second channel MBC2 has a Multi-Bridge Channel (MBC) structure and may be surrounded on four sides by the gate Gc. Here, the four sides may include both sides in the y direction and both sides in the z direction. According to an embodiment, each of the first channel MBC1 and the second channel MBC2 may include at least two nano-sheets. However, in other embodiments, at least one of the first channel MBC1 and the second channel MBC2 may include only one nanosheet.

In the 3D stacked FET 100 of this embodiment, a unit cell UC corresponds to, for example, a standard cell and may thus be used as a basic layout when designing an integrated circuit. To briefly explain the standard cell, as semiconductor devices have recently become highly integrated, a lot of time and money is required to design an integrated circuit, especially a layout for an element area. Therefore, as a kind of technology for saving this, a standard cell-based layout design technique may be used. The standard cell-based layout design technique may reduce the time required for layout design by arranging and wiring where necessary during layout design after designing logic elements such as OR gates or AND gates that are used repeatedly as standard cells in advance and storing the logic elements in a computer system.

For example, standard cells may include basic cells, such as an AND, an OR, a NOR, an inverter, a NAND, a NOR, and the like, complex cells, such as an OR/AND/INVERTER (OAI) and an AND/OR/INVERTER (AOI), and storage elements, such as simple master-slave flip-flops and latches.

The standard cell method is a method of designing a dedicated large-scale integrated (LSI) circuit tailored to the needs of customers or users by preparing logic circuit blocks having various functions, that is, cells in advance and combining these cells arbitrarily. Cells may be designed and verified in advance and registered in advance in a computer, and logic design, placement, wiring, and the like may be performed by combining the registered cells using computer aided design (CAD).

Specifically, in the case of designing/manufacturing an LSI circuit, if standardized logic circuit blocks of a certain scale, that is, standard cells, are already stored in a library, a standard cell suitable for the current design purpose is taken out of the library and placed as a plurality of cells on the chip, and by performing optimum wiring with the shortest wiring length in the wiring space between cells, it is possible to design the entire circuit. As the types of cells stored in the library become richer, design becomes more flexible, and as such, the possibility of optimal design of the chip may increase.

A unit cell of the 3D stacked FET 100 of this embodiment may include, for example, an inverter. However, in the 3D stacked FET 100 of this embodiment, a unit cell is not limited to an inverter and may include other logic elements. The inverter may be implemented by connecting a MOSFET and another MOSFET in series. Specifically, in the 3D stacked FET 100 of this embodiment, the first FET 120 corresponds to a PMOS FET, the first drain D1 may be disposed on the left side of the gate Gc, and the first source S1 may be disposed on the right side of the gate Gc in the x direction. In addition, the second FET 130 corresponds to an NMOS FET, the second source S2 may be disposed on the left side of the gate Gc, and the second drain D2 may be disposed on the right side of the gate Gc in the x direction. In addition, the first drain D1 of the first FET 120 may be connected to the first back-side power line 112 through a lower contact portion 170, and the second source S2 of the second FET 130 may be connected to a front-side power line 142 through an upper contact portion 180. The connection relationship between the first FET 120 and the second FET 130 and the back-side wiring layer 110 and the front-side wiring layer 140 is described in more detail in the description of FIGS. 2A to 5.

The front-side wiring layer 140 may include the front-side power line 142 and a front-side signal line 144. The front-side power line 142 may extend in the x direction. The front-side power line 142 may provide second power VSS, for example, power at a negative potential or a ground potential, to the second FET 130. The front-side power line 142 may be connected to the second back-side power line 114 through the second through electrode 160 disposed in a power tap cell PTC.

A plurality of front-side signal lines 144 are spaced apart from each other in the y-direction and may extend in the x-direction. The front-side signal line 144 may be connected to the second source/drain S2/D2 of the second FET 130 through a signal via (see 195 in FIG. 3A). Signals may be input/output to/from the second FET 130 through the front-side signal line 144.

Figure 3A:
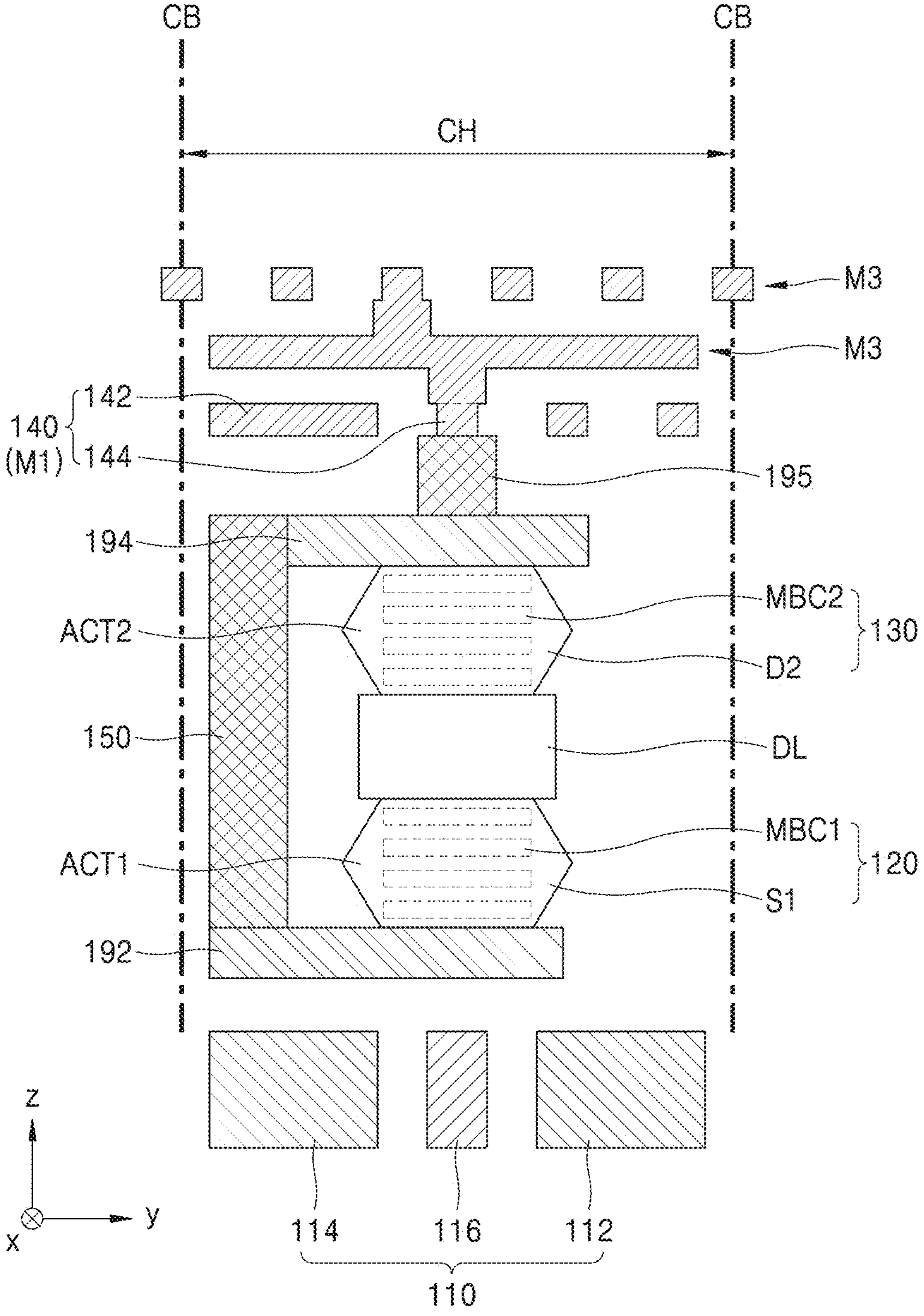
FIG. 3A is a cross-sectional view showing a portion I-I' of FIGS. 2A and 2B.

The front-side wiring layer 140 may correspond to the lowermost wiring layer, e.g., the wiring layer M1, among wiring layers having a multilayer structure disposed on the front side of the substrate. As shown in FIG. 3A, wiring layers M1, M2, M3, . . . may be disposed on the second FET 130 in a multilayer structure. In the 3D stacked FET 100 of this embodiment, the front-side wiring layer 140 may correspond to the wiring layer M1. However, according to embodiments, the front-side wiring layer 140 may include at least one other wiring layer other than the wiring layer M1.

The first through electrode 150 may connect the first FET 120 and the second FET 130 to each other in the z direction. Specifically, the first through electrode 150 may extend in the z direction and connect the first source S1 of the first FET 120 to the second drain D2 of the second FET 130.

As described above, the second through electrode 160 may be disposed in the power tap cell PTC and connect the front-side power line 142 and the second back-side power line 114 to each other. One power tap cell PTC may be disposed for every tens to hundreds of contact poly pitches (CPPs) in the x direction. For example, in the 3D stacked FET 100 of this embodiment, one power tap cell PTC may be disposed for every 60 or so CPPs.

For reference, in the 3D stacked FET 100 of this embodiment, the CPP may refer to a gate pitch in the x direction. In addition, in the 3D stacked FET 100 of this embodiment, two CPPs may constitute one unit cell UC. More specifically, in the 3D stacked FET 100 of this embodiment, the unit cell UC may be defined as an area up to ½ of each of two outer gates Go1 and Go2 on both sides of the gate Gc at the center in the x direction, and an area including the first back-side power line 112 and the second back-side power line 114 in the y-direction. These unit cells UC may be arranged in a two-dimensional array structure in the x and y directions. FIG. 1 shows a form in which a plurality of unit cells are disposed in the x direction with a width of one unit cell UC in the y direction, that is, a cell height CH. In addition, it is shown that the second through electrode 160 is disposed in the power tap cell PTC at the right end in the x direction.

Figure 2A:
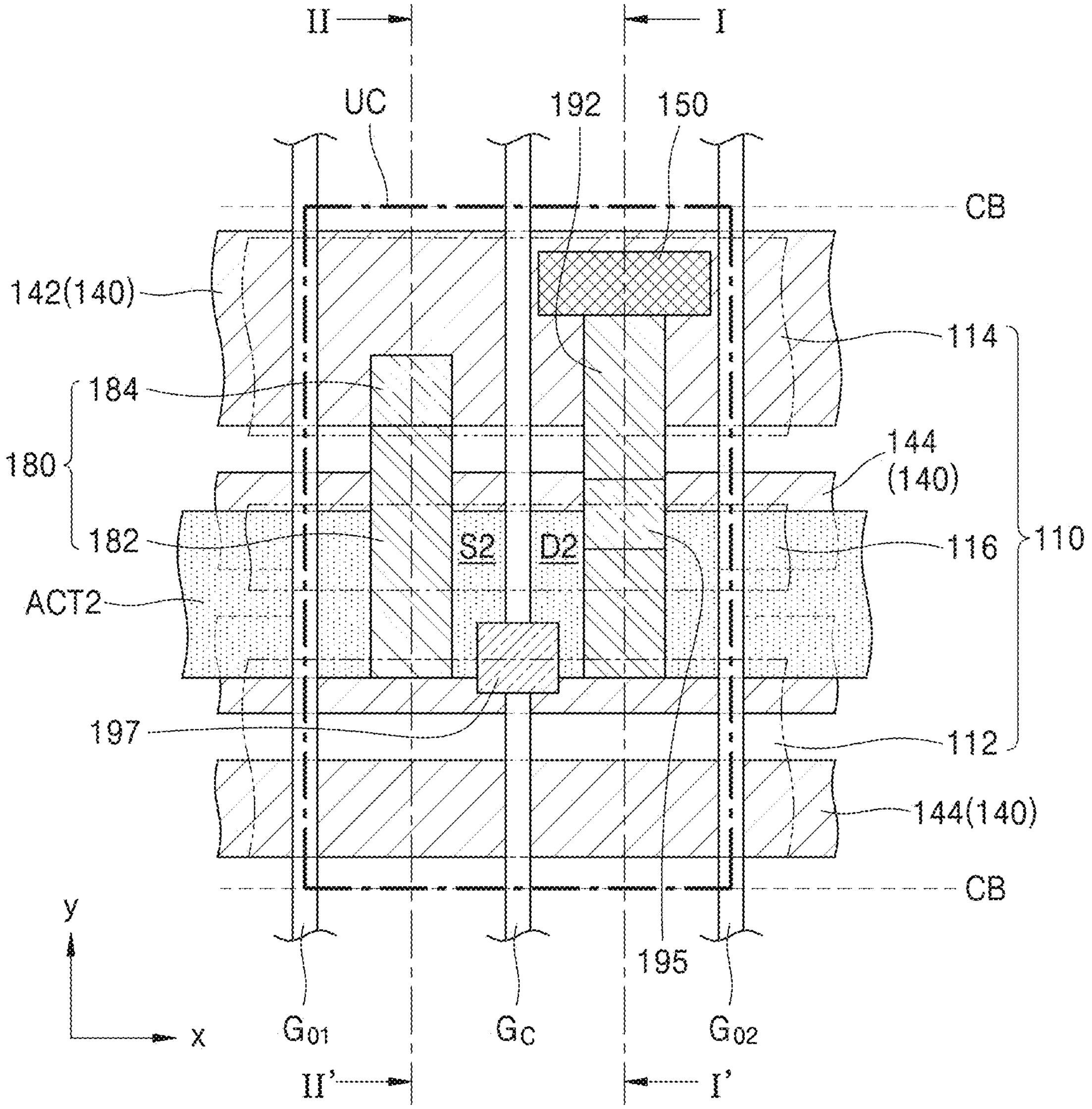
FIGS. 2A and 2B are plan views of a unit cell of the 3D stacked FET of FIG. 1.
Figure 2B:
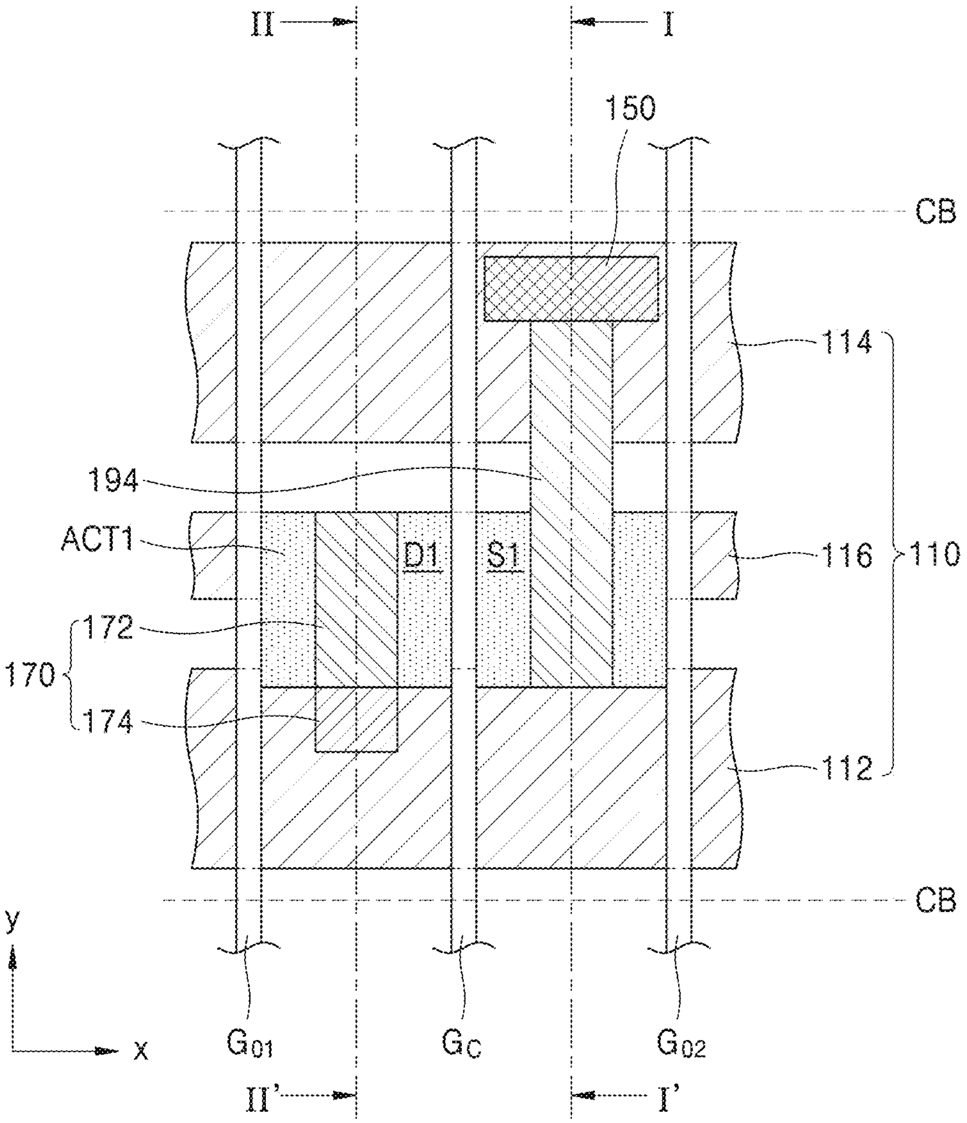
Figure 3B:
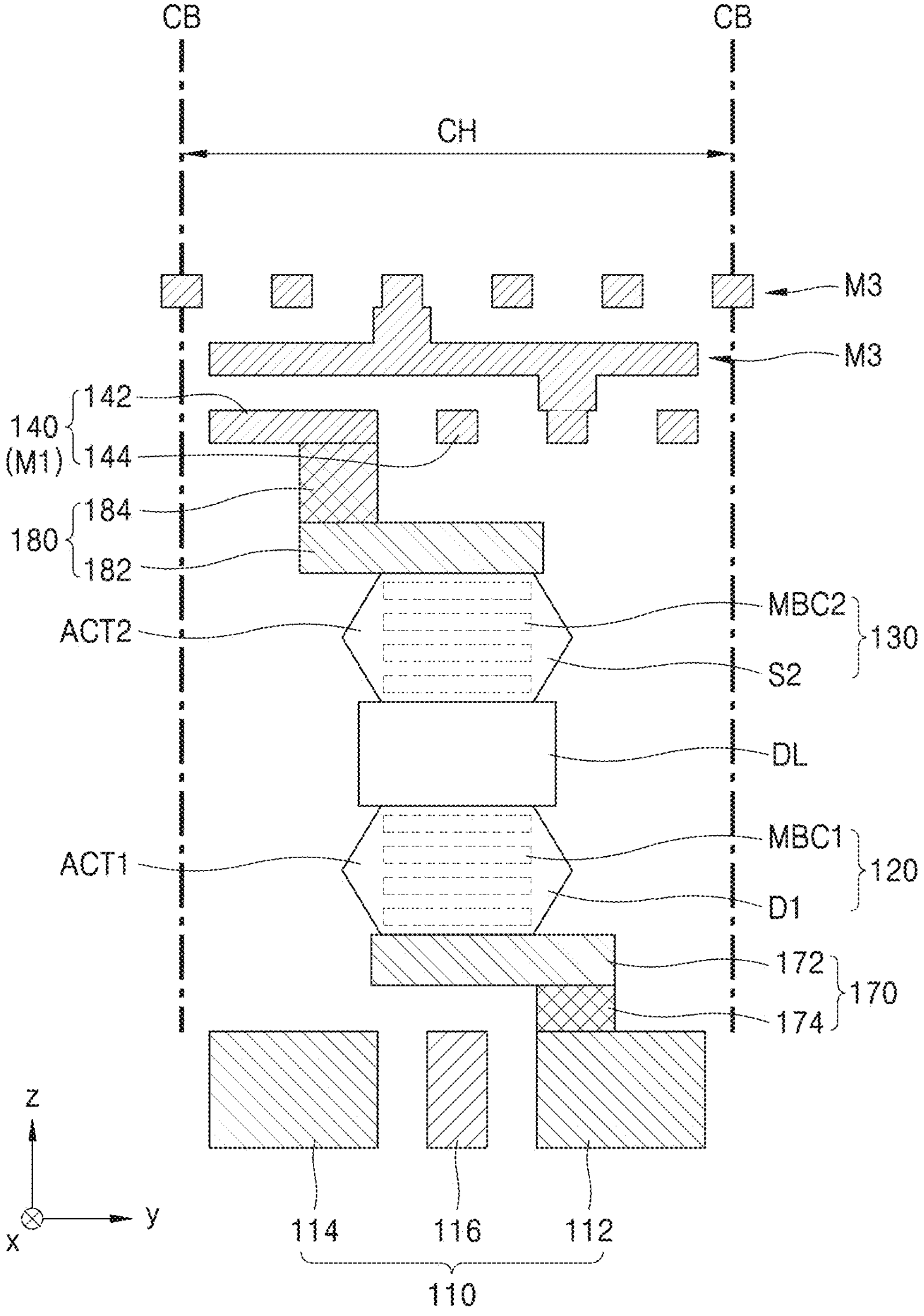
FIG. 3B is a cross-sectional view showing a section II-II' of FIGS. 2A and 2B.

FIGS. 2A and 2B are plan views of a unit cell of the 3D stacked FET 100 of FIG. 1, and FIG. 2A is a plan view of a portion corresponding to the second FET 130 on the upper side, and FIG. 2B is a plan view of a portion corresponding to the first FET 120 on the lower side. FIG. 3A is a cross-sectional view showing a portion I-I' of FIGS. 2A and 2B, and FIG. 3B is a cross-sectional view showing a portion II-II' of FIGS. 2A and 2B. The description is given with reference to FIG. 1 together, and the descriptions already given in the description of FIG. 1 are briefly given or omitted.

Referring to FIGS. 2A to 3B, in the 3D stacked FET 100 of this embodiment, the first FET 120 may be disposed on the lower side and the second FET 130 may be disposed on the upper side. The 3D stacked FET 100 of this embodiment may include an inverter in a unit cell UC. Accordingly, the first FET 120 may be a PMOS FET and the second FET 130 may be an NMOS FET. However, depending on the embodiment, the upper and lower positions of the first FET 120 and the second FET 130 may be changed with each other.

FIGS. 2A and 2B show plan views at different levels in the z direction. That is, FIG. 2A is a plan view from above the front-side wiring layer 140, showing a portion of the second FET 130. FIG. 2B is a plan view from above the first active region ACT1, showing a portion of the first FET 120. Accordingly, the cutting lines I-I' of FIGS. 2A and 2B may be identical to each other and the cutting lines II-II' of FIGS. 2A and 2B may be identical to each other. That is, the cross-sectional view along the line I-I' of FIG. 2A corresponds to the portion from the second FET 130 to the front-side wiring layer 140 in the cross-sectional view of FIG. 3A, and the cross-sectional view along the line I-I' of FIG. 2B may correspond to a portion from the back-side wiring layer 110 to the first FET 120 in the cross-sectional view of FIG. 3A. In addition, the cross-sectional view along the line II-II' of FIG. 2A corresponds to a portion from the second FET 130 to the front-side wiring layer 140 in the cross-sectional view of FIG. 3B, and the cross-sectional view along the line II-II' of FIG. 2B may correspond to a portion from the back-side wiring layer 110 to the first FET 120 in the cross-sectional view of FIG. 3B.

Meanwhile, on the positions of the cutting lines I-I' and II-II' in the x direction, the first and second channels MBC1 and MBC2 may not be visible in FIGS. 3A and 3B. In other words, the first and second channels MBC1 and MBC2 may be at positions corresponding to the gate Gc in the x direction and surrounded by the gate Gc. In practice, the first and second channels MBC1 and MBC2 may be seen when cutting part of the gate Gc. Accordingly, in FIGS. 3A and 3B, the first and second channels MBC1 and MBC2 are indicated by dashed lines and may be located inside or outside the paper plane in the x direction. In FIGS. 3A and 3B, the cell height CH of the unit cell UC in the y-direction is indicated by double-headed arrows.

Additionally, in FIG. 2A, a rectangular portion surrounded by a thick one-dot chain line may correspond to a unit cell UC. A boundary of the unit cell UC in the y direction may correspond to a cell boundary CB. In addition, the boundary of the unit cell UC in the x direction may correspond to half of each of the outer gates Go1 and Go2 disposed on both sides of the gate Gc at the center.

Specifically, a connection relationship between the first FET 120 and the second FET 130 and the back-side wiring layer 110 and the front-side wiring layer 140 will be described.

As shown in FIG. 2B, in the first FET 120, the first drain D1 may be disposed on the left side and the first source S1 may be disposed on the right side of the gate Gc in the x direction. In addition, as shown in FIG. 2A, in the second FET 130, the second source S2 may be disposed on the left side of the gate Gc in the x direction and the second drain D2 may be disposed on the right side of the gate Gc.

As shown in FIG. 3B, the first drain D1 of the first FET 120 may be connected to the first back-side power line 112 through the lower contact portion 170. The lower contact portion 170 may include a first drain contact 172 and a first power via 174. The first drain contact 172 may contact the first drain D1 and extend in the y direction. The first power via 174 may connect the first drain contact 172 to the first back-side power line 112. Accordingly, at least a portion of the first drain contact 172 and the first back-side power line 112 may overlap in the z direction, and a first power via 174 may be disposed on the overlapping portion to connect the first drain contact 172 to the first back-side power line 112.

Also, the second source S2 of the second FET 130 may be connected to the front-side power line 142 through the upper contact portion 180. The upper contact portion 180 may include a second source contact 182 and a second power via 184. The second source contact 182 may contact the second source S2 and extend in the y direction. The second power via 184 may connect the second source contact 182 to the front-side power line 142. Accordingly, at least a portion of the second source contact 182 and the front-side power line 142 overlap in the z direction, and a second power via 184 may be disposed on the overlapped portion to connect the second source contact 182 to the front-side power line 142.

As may be seen from FIGS. 2B and 3B, the first drain contact 172 and the second source contact 182 may partially overlap each other in the z direction. For example, in FIG. 3B, the first drain contact 172 may extend to the right in the y-direction from the first active region ACT1 and the second source contact 182 may extend to the left in the y-direction from the second active region ACT2. Accordingly, the first drain contact 172 and the second source contact 182 may overlap each other by the width at which the first active region ACT1 and the second active region ACT2 overlap each other.

As shown in FIG. 3A, the first source S1 of the first FET 120 may be connected to a lower portion of the first through electrode 150 through the first source contact 192. The first source contact 192 may extend in the y direction. Also, the second drain D2 of the second FET 130 may be connected to an upper portion of the first through electrode 150 through the second drain contact 194. The second drain contact 194 may extend in the y direction.

In addition, the second drain contact 194 may be connected to the front-side signal line 144 of the front-side wiring layer 140 through the signal via 195. For example, an output signal of the inverter may be output through the signal via 195. In addition, a gate via 197 may be disposed on the gate Gc and the gate via 197 may be connected to the front-side signal line 144 of the front-side wiring layer 140. For example, an input signal may be applied to the inverter through the gate via 197. For reference, here, the front-side signal line 144 connected to the signal via 195 and the front-side signal line 144 connected to the gate via 197 may be different signal lines.

As may be seen from FIGS. 2A and 3A, the first source contact 192 and the second drain contact 194 may overlap in the z direction. For example, in FIG. 3A, the first source contact 192 may extend from the first active region ACT1 to the left in the y direction, and in addition, the second drain contact 194 may also extend leftward in the y direction from the second active CT2. Accordingly, the first source contact 192 and the second drain contact 194 may substantially and entirely overlap each other.

For reference, the active region ACT may include a semiconductor material, such as Si, SiGe, Ge, SiGeSn, GaAs, InSb, GaP, GaSb, InAlAs, InGaAs, GaSbP, GaAsSb, or InP. In the 3D stacked FET 100 of this embodiment, the active region ACT may include Si or SiGe.

In addition, each of the gate Gc and the outer gates Go1 and Go2 may include a gate dielectric layer, one or more work function control layers, and a gate electrode layer. The gate dielectric layer may include, for example, silicon oxide, silicon nitride, high-k dielectric materials, other dielectric materials, and/or combinations thereof, and may include at least one of dielectric materials. High-k dielectric materials may include, for example, HfO2, HfSiO, HfSiON, HfTaO, HfTiO, HfZrO, zirconium oxide, aluminum oxide, titanium oxide, hafnium dioxide-alumina ($HfO_2$—$Al_2O_3$) alloys, other high-k dielectric materials, and/or a combination thereof. In some embodiments, the gate dielectric layer may include an interfacial layer formed between the channel layers and the dielectric material. In some embodiments, the gate dielectric layer may be formed using an atomic layer deposition (ALD) process to have a uniform thickness around each of the channel layers. However, the method of forming the gate dielectric layer is not limited to the ALD process. In some embodiments, the gate dielectric layer may have a thickness ranging from about 1 nm to about 6 nm.

A gate electrode layer may be formed on the gate dielectric layer to surround each of the first and second channels MBC1 and MBC2. The gate electrode layer may include polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other conductive materials, and/or combinations thereof, and may include one or more conductive materials.

One or more work function control layers may be disposed on the gate dielectric layer. The work function control layer may include a single layer of TiN, TaN, TaAlC, TiC, TaC, Co, Al, TiAl, HfTi, TiSi, TaSi, or TiAlC, or a multilayer of a combination of two or more of these materials.

Furthermore, the contacts 172, 182, 192, and 194 and/or the vias 174, 184, 195, and 197 connected to the first FET 120 and the second FET 130 may include the same conductive material or different conductive materials. For example, the conductive material may include Co, Ni, W, Ti, Ta, Cu, Al, TiN, TaN, or other conductive materials. In some embodiments, a silicide layer may be formed on the first and second sources/drains S1/D1 and S2/D2 prior to forming the conductive material. The silicide layer may include at least one of WSi, CoSi, NiSi, TiSi, MoSi, and TaSi.

In some embodiments, the back-side wiring layer 110 and the front-side wiring layer 140 may include at least one of Co, Ni, W, Ti, Ta, Cu, Al, TiN, and TaN.

In some embodiments, the first channel MBC1 of the first FET 120 and the second channel MBC2 of the second FET 130 may include the same material, e.g., Si. In other embodiments, the first channel MBC1 and the second channel MBC2 may include different materials. For example, the first channel MBC1 may include SiGe and the second channel MBC2 may include Si.

In the 3D stacked FET 100 of this embodiment, the second source S2 of the second FET 130 may be connected to the second back-side power line 114 through the second source contact 182, the second power via 184, the front-side power line 142, and the second through electrode 160. Based on this power wire connection structure, in the 3D stacked FET 100 of this embodiment, one through electrode in the unit cell UC may be omitted. Accordingly, the 3D stacked FET 100 of the present embodiment may sufficiently secure a channel width without increasing the cell height CH in the y direction. The omission of one through electrode and the securing of the channel width is described in more detail in the description of FIGS. 6A and 6B.

Figure 4A:
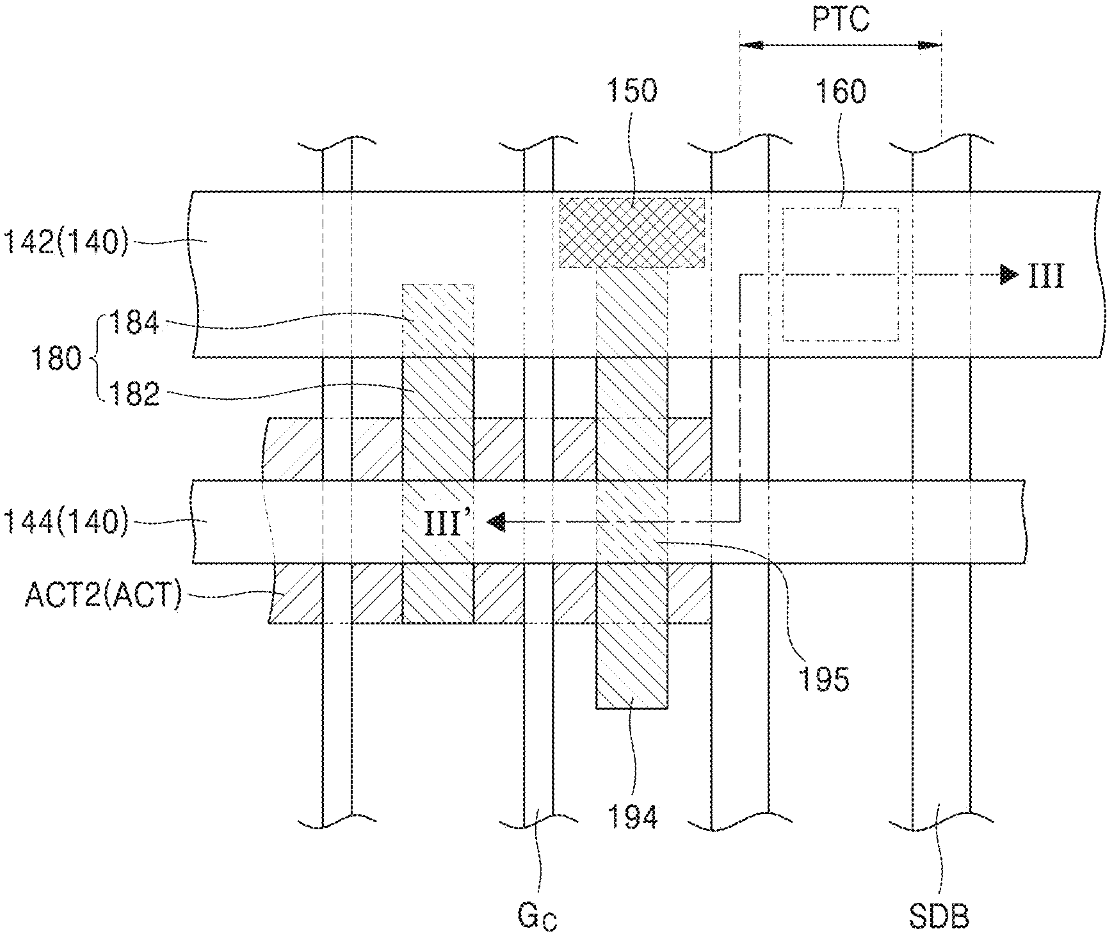
FIG. 4A is a plan view of a portion of a power tap cell of the 3D stacked FET of FIG. 1.
Figure 4B:
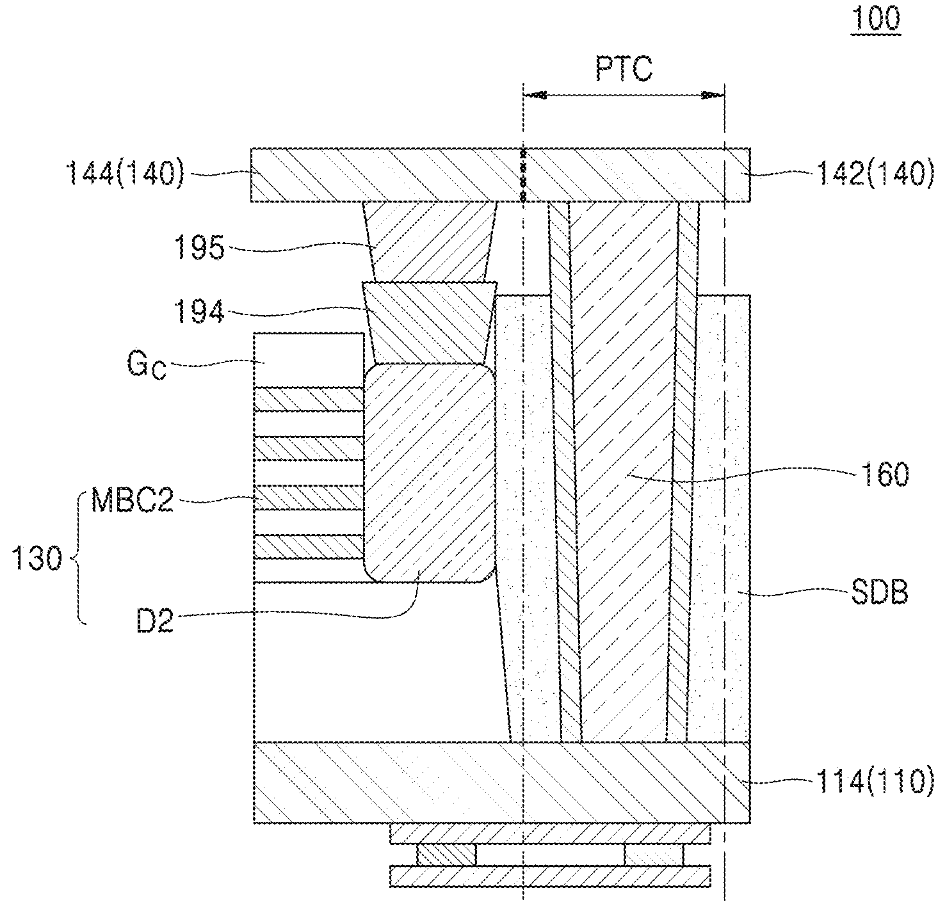
FIG. 4B is a cross-sectional view showing a section III-III' of FIG. 4A through cutting.

FIG. 4A is a plan view of a portion of a power tap cell of the 3D stacked FET of FIG. 1, and FIG. 4B is a cross-sectional view of portion III-III' of FIG. 4A. The description is also given with reference to FIG. 1, and the descriptions already given in the description of FIGS. 1 to 3B are briefly given or omitted.

Referring to FIGS. 4A and 4B, in the 3D stacked FET 100 according to the present embodiment, power tap cells PTCs may be disposed every tens to hundreds of CPPs in the x direction. For example, power tap cells PTCs may be disposed for every 60 CPPs in the x direction. A second through electrode 160 may be disposed in the power tap cell PTC. As may be seen from FIG. 4B, a single diffusion break (SDB) may be disposed on both sides of the power tap cell PTC in the x direction. Here, the power tap cell PTC may include an area corresponding to one unit cell UC in the x and y directions, as shown in FIG. 1. In addition, the second through electrode 160 may be disposed at a portion where the front-side power line 142 and the power tap cell PTC overlap. In FIG. 1, as the power tap cell PTC is defined to have an area corresponding to the unit cell UC, one more SDB may be disposed at a central portion in the x direction. However, according to embodiments, the power tap cell PTC may be defined between two adjacent SDBs in the x direction, and in such a case, the power tap cell PTC has an area half that of the unit cell UC.

For reference, the SDB may have substantially the same width as the gates, that is, the gate Gc and the outer gates Go1 and Go2, in the x direction. For example, in the SDB, an insulating layer having substantially the same width as the gate may extend into the semiconductor substrate to isolate the active region ACT. Unlike a double diffusion break (DDB), a separate dummy gate does not exist in the SDB, and an upper portion of an insulating layer constituting the SDB may protrude on the substrate in correspondence with the gate.

Furthermore, the DDB, as an active separation structure different from the SDB, may be formed across two gates. For example, the DDB may be formed by disposing an insulating layer in a buried structure under two adjacent gates in the x direction. Accordingly, the DDB has a width corresponding to a pitch between gates in the x direction, e.g., CPP, and in the DDB, the upper two gates may correspond to dummy gates.

On the other hand, when considering the area of a cell, two cells including DDB may be larger than two cells including SDB by 1 CPP in the x direction. Therefore, cells including the SDB may be useful in terms of area. In addition, the insulating layers constituting the DDB and the SDB may include a compressive stress material and/or a tensile stress material. Here, the compressive stress material is a material capable of applying compressive stress to the active region, and the tensile stress material is a material capable of applying tensile stress to the active region. For example, the insulating layer of the SDB may include silicon nitride, and the insulating layer of the DDB may include tetraethoxysilane (TEOS). However, the materials of the insulating layers of the DDB and SDB are not limited to the above materials.

As shown in FIG. 4A, the front-side power line 142 may be directly connected to the top of the second through electrode 160 disposed in the power tap cell PTC. In the 3D stacked FET 100 of this embodiment, the second through electrode 160 may correspond to a front-side through electrode. The front-side through electrode may refer to a through electrode formed on the front side of the substrate. Accordingly, as shown in FIG. 4B, the upper portion may be wider and the lower portion may be narrow.

For reference, in the case of a DRAM chip, the through electrode has a relatively large length in μm, but in the 3D stacked FET 100 of this embodiment, the first through electrode 150 or the second through electrode 160 may have a very small length of several tens to hundreds of nm. Accordingly, the first through electrode 150 or the second through electrode 160 may be referred to as a tall via, nano TVS, or tap via. Here, the nano TSV may refer to an electrode having a nano size and penetrating Si.

On the other hand, as shown in FIG. 4B, a second channel MBC2 is disposed under the gate Gc, a second drain D2 is disposed to the right of the gate Gc in the x direction, and the second drain D2 may be connected to the front-side signal line 144 of the front-side wiring layer 140 through the second drain contact 194 and the signal via 195. Also, the second drain D2 may be connected to the first through electrode 150 through the second drain contact 194.

In addition, although not shown in the cross-sectional view of FIG. 4B, a second source S2 is disposed to the left of the gate Gc in the x direction, and the second source S2 may be connected to the front-side power line 142 through the second source contact 182 and the second power via 184. The front-side power line 142 may extend in the x direction and be connected to the second through electrode 160 in the power tap cell PTC. The second through electrode 160 may be connected to the second back-side power line 114 of the back-side wiring layer 110. As a result, the second source S2 of the second FET 130 may be connected to the second back-side power line 114 through the second source contact 182, the second power via 184, the front-side power line 142, and the second through electrode 160. On the other hand, in FIG. 4B, the front-side wiring layers 140 to the left and right of the thick one-dashed line are different from each other, and the right side may correspond to the front-side power line 142 and the left side may correspond to the front-side signal line 144.

Figure 5:
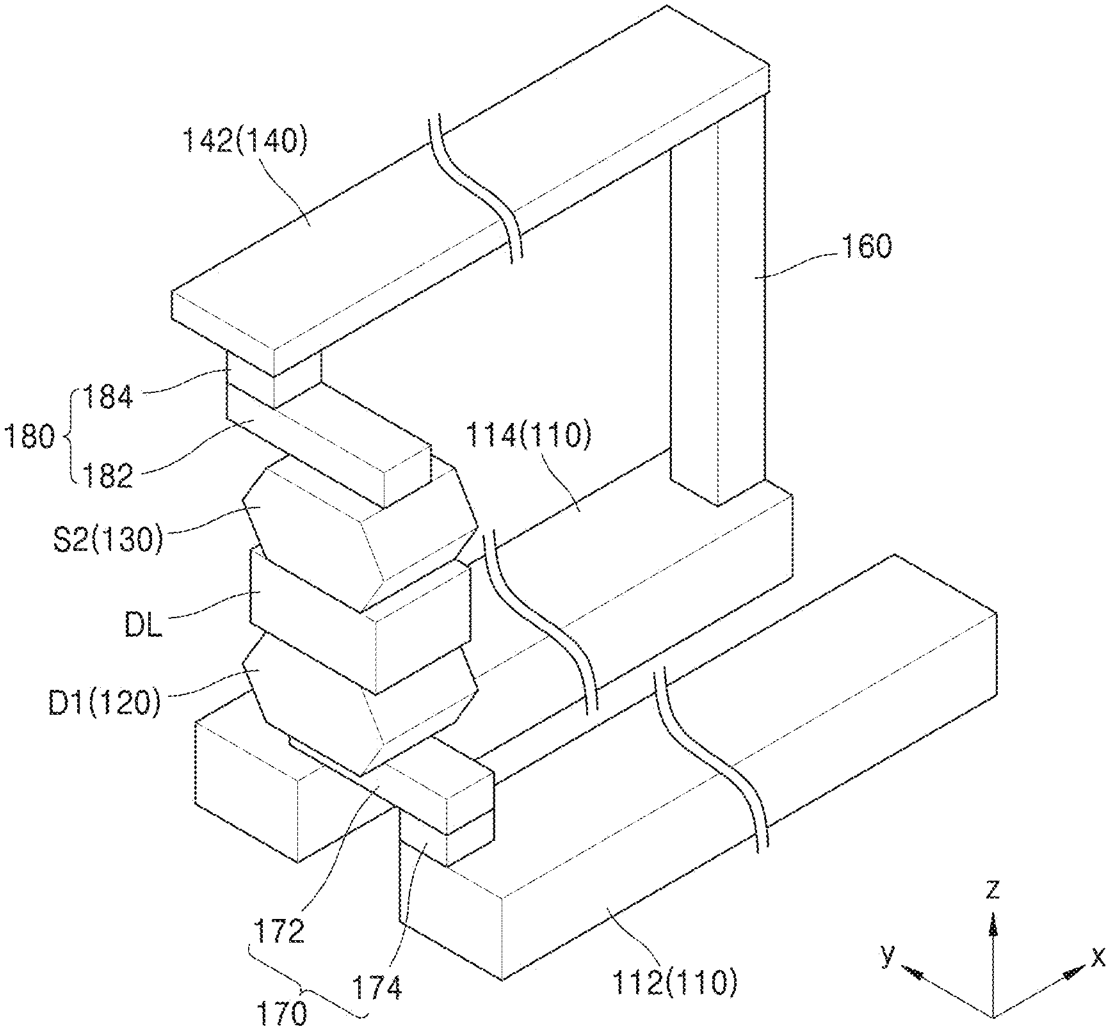
FIG. 5 is a perspective view schematically illustrating a power wiring connection structure of a unit cell of the 3D stacked FET of FIG. 1.

FIG. 5 is a perspective view schematically showing a power wire connection structure of a unit cell of the 3D stacked FET of FIG. 1, and only main components connected in the third direction are shown and the remaining components are omitted. The description is also given with reference to FIGS. 1 to 4B together.

Referring to FIG. 5, in the 3D stacked FET 100 of this embodiment, the back-side wiring layer 110 may be disposed at the bottom in the z direction. Also, the back-side wiring layer 110 may include a first back-side power line 112 and a second back-side power line 114. The first back-side power line 112 and the second back-side power line 114 may be spaced apart from each other in the y-direction and extend in the x-direction.

The first FET 120 may be disposed on the back-side wiring layer 110. In FIG. 5, only the first drain D1 of the first FET 120 is shown. The first drain D1 may be connected to the first back-side power line 112 through the first drain contact 172 and the first power via 174.

A second FET 130 may be disposed on the first FET 120. In FIG. 5, only the second source S2 of the second FET 130 is shown. The second source S2 may be connected to the front-side power line 142 of the front-side wiring layer 140 through the second source contact 182 and the second power via 184. A dielectric film DL may be disposed between the first drain D1 and the second source S2 in the z direction.

In the z direction, the front-side wiring layer 140 may be disposed at the top. In FIG. 5, only front-side power line 142 is shown. The front-side power line 142 may extend in the x direction. A power tap cell PTC may be disposed in the x direction, for example, every 60 CPPs, and the second through electrode 160 may be disposed on the power tap cell PTC. The second through electrode 160 may connect the second back-side power line 114 of the back-side wiring layer 110 to the front-side power line 142 of the front-side wiring layer 140.

In the 3D stacked FET 100 of this embodiment, the second source S2 of the second FET 130 may be connected to the second back-side power line 114 through the second source contact 182, the second power via 184, the front-side power line 142, and the second through electrode 160. Based on this power wire connection structure, in the 3D stacked FET 100 of this embodiment, one through electrode in the unit cell UC may be omitted. Accordingly, the width of the channel may be sufficiently secured without increasing the cell height CH in the y-direction.

Figure 6A:
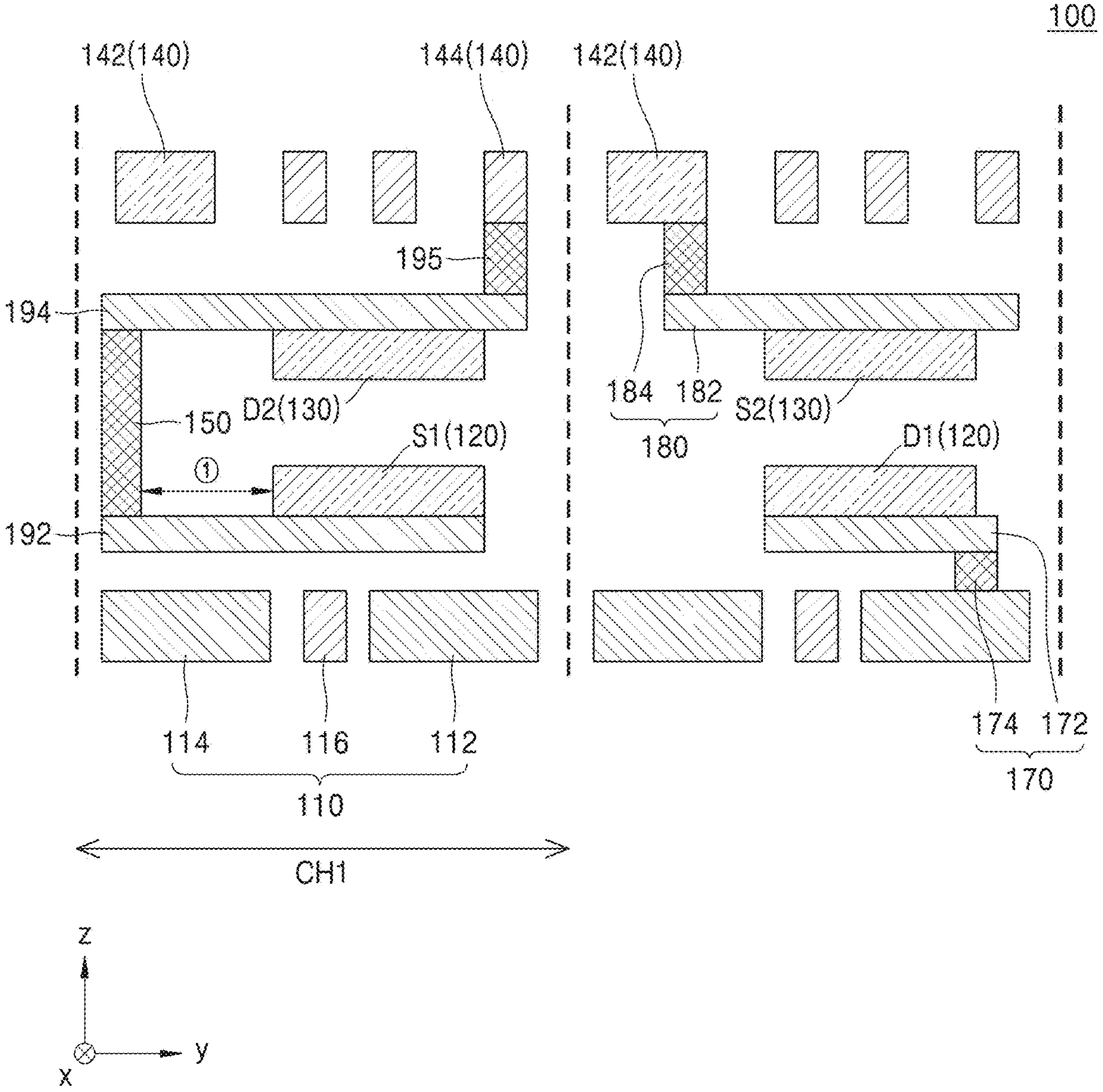
FIGS. 6A and 6B are conceptual diagrams schematically showing vertical structures of a 3D stacked FET of this embodiment and a 3D stacked FET of a comparative example.
Figure 6B:
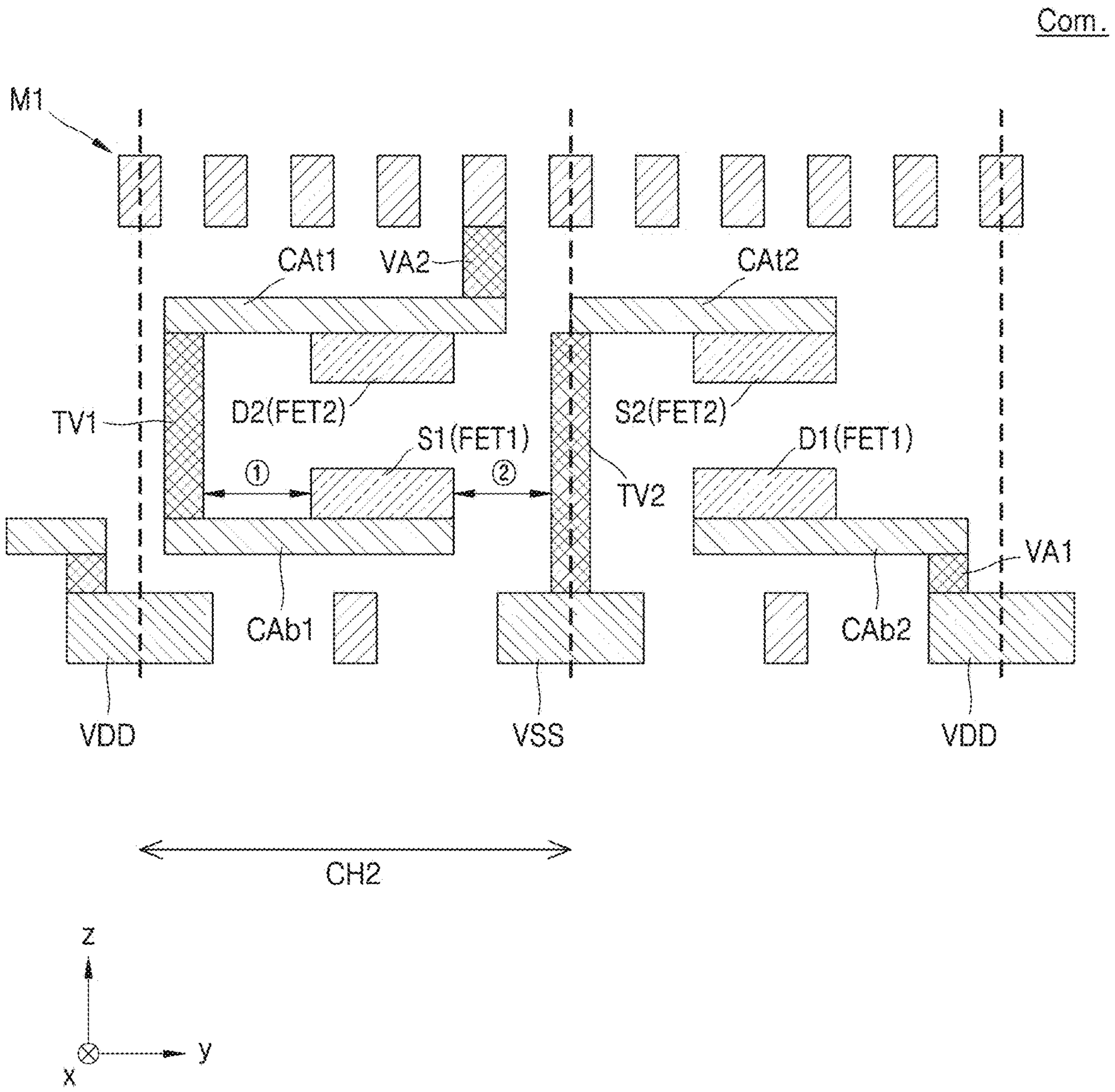

FIG. 6A is a conceptual diagram of a 3D stacked FET of this embodiment, which is a simplified combination of FIGS. 3A and 3B, and FIG. 6B is a conceptual diagram of a 3D stacked FET of a comparative example corresponding to FIG. 6A. The description is also given with reference to FIGS. 1 to 3B, and descriptions already given in the description of FIGS. 1 to 5.

Referring to FIG. 6A, in the case of the 3D stacked FET 100 of this embodiment, only the first through electrode 150 connecting the first FET 120 to the second FET 130 may be disposed in the unit cell, and other through electrodes may not be disposed. Specifically, the first source S1 of the first FET 120 is connected to the lower surface of the first through electrode 150 through the first source contact 192, and the second drain D2 of the second FET 130 is connected to the upper surface of the first through electrode 150 through the second drain contact 194, such that the first source S1 and the second drain D2 may be connected to each other through the first through electrode 150.

In addition, in the 3D stacked FET 100 of this embodiment, the first drain D1 of the first FET 120 may be connected to the first back-side power line 112 through the first drain contact 172 and the first power via 174, and the second source S2 of the second FET 130 may be connected to the front-side power line 142 through the second source contact 182 and the second power via 184. Accordingly, a through electrode connecting the second source S2 of the second FET 130 to the second back-side power line 114 may not be disposed in the unit cell.

Accordingly, the 3D stacked FET 100 according to the present embodiment may sufficiently secure the channel width in the y-direction without increasing the cell height CH1 in the y-direction. In FIG. 6A, the y-direction width of the first or second source/drain S1/D1 or S2/D2 may correspond to the channel width. Specifically, the widths in the y direction of the first channel MBC1 disposed in the x direction between the first source S1 and the first drain D1 and the second channel MBC2 disposed in the x direction between the second source S2 and the second drain D2 may correspond to the channel widths.

Referring to FIG. 6B, in the case of the 3D stacked FET Com. of the comparative example, a first FET FET1 and a second FET FET2 are connected in a unit cell through a first through electrode TV1. That is, the first source S1 of the first FET FET1 is connected to the lower surface of the first through electrode TV1 through the bottom source contact CAb1, and the second drain D2 of the second FET FET2 is connected to the upper surface of the first through electrode TV1 through the top drain contact CAt1, so that the first source S1 and the second drain D2 may be connected through the first through electrode TV1.

On the other hand, in the 3D stacked FET Com. of the comparative example, the first drain D1 of the first FET FET1 may be connected to the first back-side power line VDD through the bottom drain contact CAb2 and the first power via VA1, and the second source S2 of the second FET FET2 may be connected to the second back-side power line VSS through the top source contact CAt2 and the second through electrode TV2. Accordingly, two through electrodes (the first and second through electrodes TV1 and TV2) may be disposed in the y direction in the unit cell.

Accordingly, the cell height CH2 of the 3D stacked FET Com. of the comparative example may increase in the y direction. For reference, when the through electrode is disposed, a minimum distance from an adjacent active, e.g., source/drain may be required. Specifically, in FIG. 6B, as the through electrodes (the first and second through electrodes TV1 and TV2) are disposed on both sides of the first source S1 in the y direction, distances ① and ② are required. Also, as shown in FIG. 6B, even in the case of having a structure in which the second through electrode TV2 is shared with adjacent cells, a gap corresponding to ½ of the width of the second through electrode TV2 in the y direction may be additionally required. Therefore, to sufficiently secure a channel width, an increase in the cell height CH2 may be required.

On the other hand, in the case of the 3D stacked FET 100 of this embodiment, only the first through electrode 150 is disposed in the unit cell UC, and therefore, since only a distance ① between the first source S1 and the first through electrode 150 is required in the y direction, a sufficient channel width may be secured without increasing the cell height CH1.

A unit cell UC of the 3D stacked FET 100 of this embodiment may include an inverter. By connecting the second source S2 of the NMOS FET of the inverter, that is, the second source S2 of the second FET 130 to the second back-side power line 114 of the back-side wiring layer 110 through the wiring layer M1, for example, the front-side power line 142 of the front-side wiring layer 140 and the second through electrode 160 of the power tap cell PTC, one through electrode in the unit cell UC of the inverter may be omitted. The concept of detouring power transmission using the wiring layer M1 and the through electrode of the power tap cell PTC is not limited to the inverter. For example, the detouring concept of power transfer may be applied to various logic circuits such as an AND and an OR employing a standard cell structure. In addition, the concept of bypassing power transfer may be applied not only to 3D stacked FETs but also to 2D FETs. In the case of a 2D FET, since the length of the through electrode is not large, the necessity of removing the through electrode may not be great. However, there is still an advantage of omitting the through electrode in terms of maintaining or reducing the cell height.

Figure 7A:
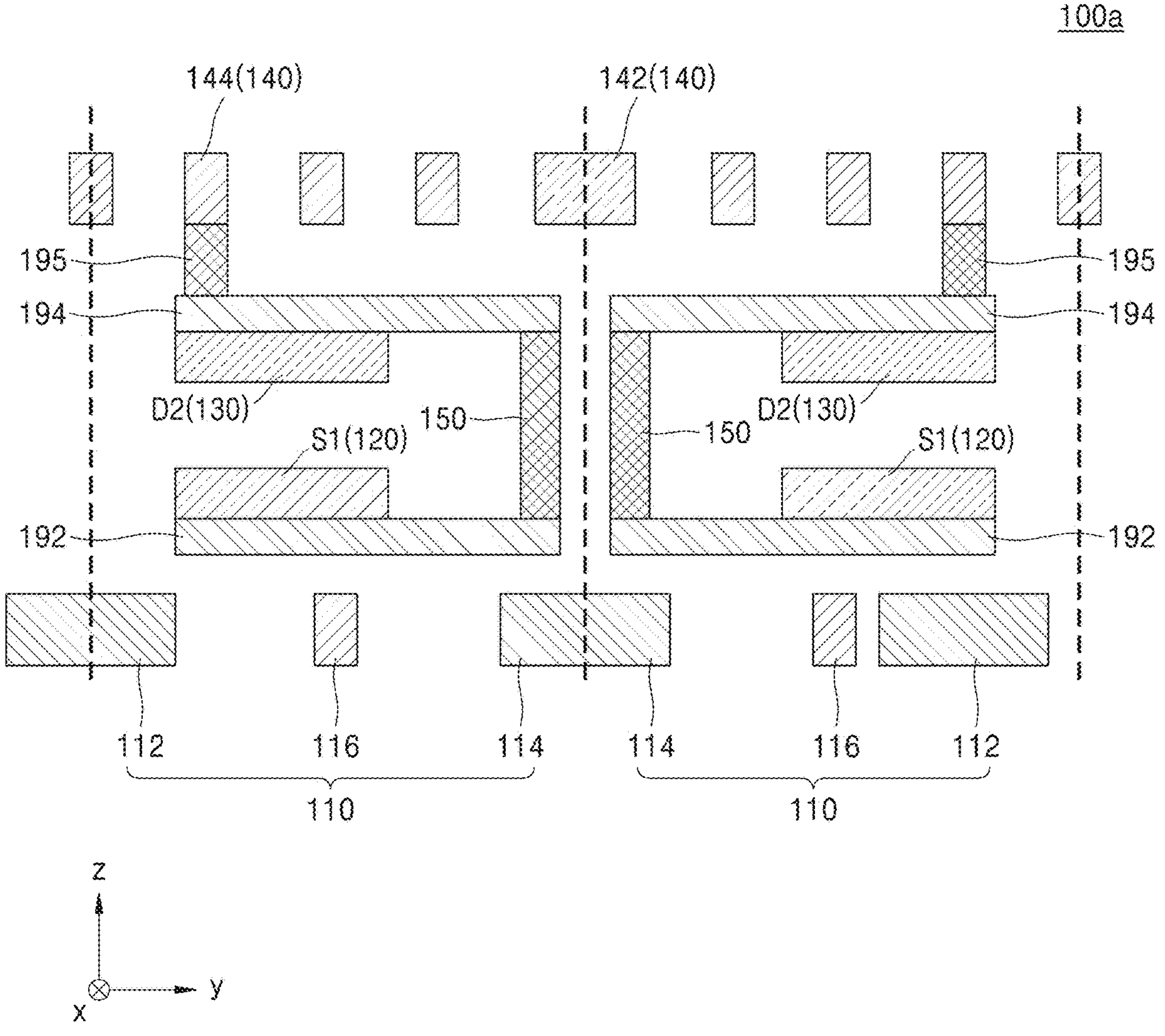
FIGS. 7A and 7B are conceptual diagrams schematically illustrating a vertical structure of a 3D stacked FET according to embodiments of the inventive concept.
Figure 7B:
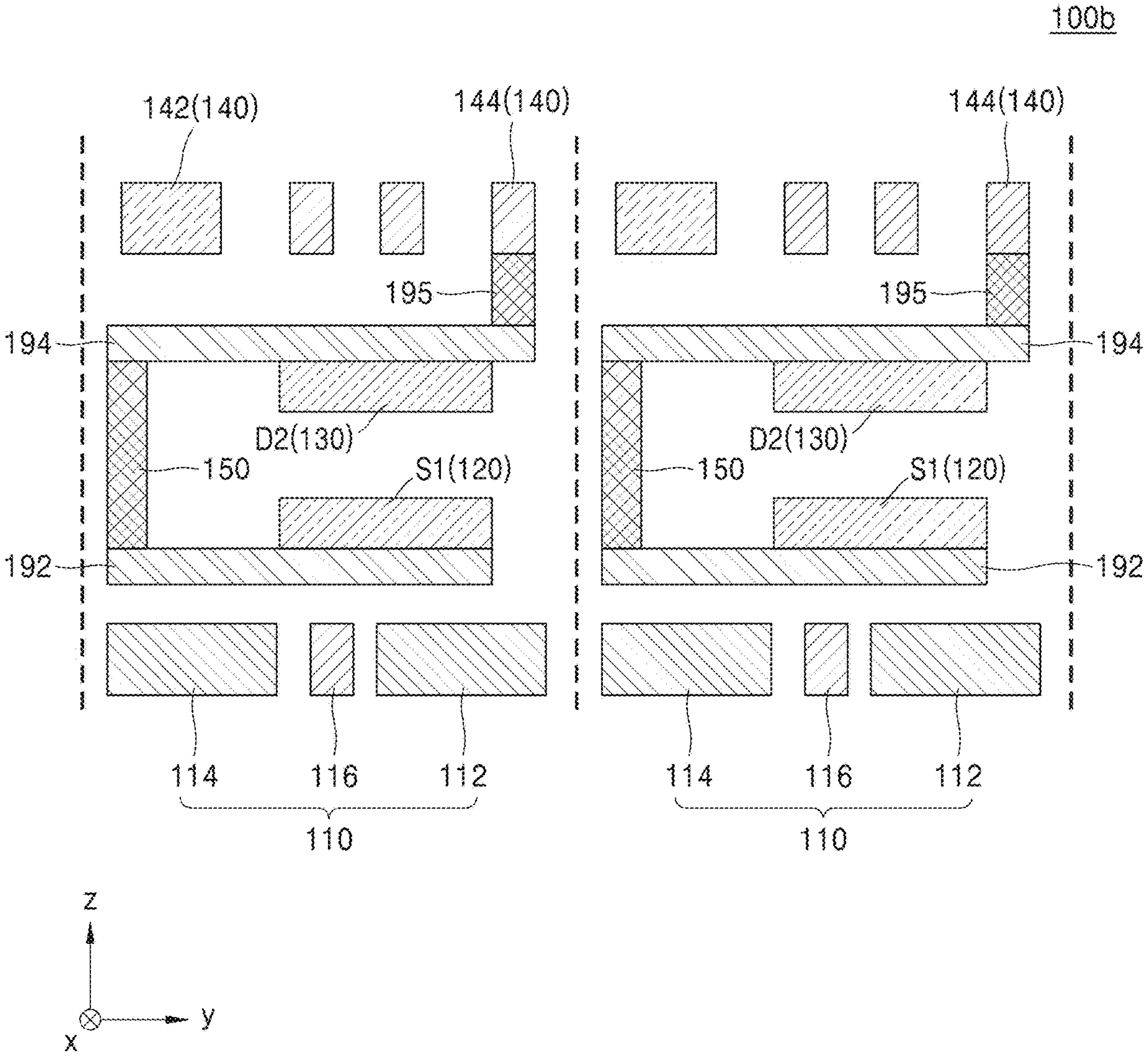

FIGS. 7A and 7B are conceptual diagrams schematically illustrating a vertical structure of a 3D stacked FET according to embodiments of the inventive concept. FIG. 7A simplifies FIG. 3A and arranges two in a mirror symmetrical structure in the y-direction, and FIG. 7B simplifies FIG. 3A and arranges two in a repeating structure in the y-direction. The description is also given with reference to FIGS. 1 to 3B, and descriptions already given in the description of FIGS. 1 to 6B are briefly given or omitted.

Referring to FIG. 7A, in a 3D stacked FET 100*a* according to the present embodiment, the first FET 120 and the second FET 130 may be disposed in a mirror symmetrical structure in the y direction. Accordingly, the first through-electrodes 150 may be disposed adjacent to each other between unit cells UC adjacent to each other in the y-direction alternately left and right in the y-direction. This arrangement structure is called an on-grid arrangement structure, and the first back-side power line VDD or the second back-side power line VSS may be shared and used between cells adjacent in the y direction. In the case of the on-grid arrangement structure, there is an advantage in that the number of power lines of the back-side wiring layer 110 may be reduced.

In the 3D stacked FET 100*a* of this embodiment, only the first through electrode 150 is disposed in the unit cell in the y direction, and the second source S2 of the second FET 130 may be connected to the second back-side power line 114 through the second source contact 182, the second power via 184, the front-side power line 142, and the second through electrode 160.

Referring to FIG. 7B, in a 3D stacked FET 100*b* of this embodiment, the first FET 120 and the second FET 130 may be arranged in a repeating structure in the y-direction. Therefore, the first through electrodes 150 may not be adjacent to each other between unit cells UC adjacent in the y direction. This deployment structure is called an off-grid arrangement structure, and in the y direction, the first back-side power line 112 and the second back-side power line 114 are alternately disposed and adjacent unit cells do not share power lines. In addition, the first through electrode 150 may be disposed at a position corresponding to the second back-side power line 114 for each unit cell UC in the y direction. In the case of the off-grid arrangement structure, the first through-electrode 150 is freely disposed to a certain extent beyond the restriction of the distance between the first and second drain contacts 192 and 194 adjacent to each other in the y-direction, such that there is an advantage in that restrictions of design rules may be alleviated at the cell boundary.

Figure 8A:
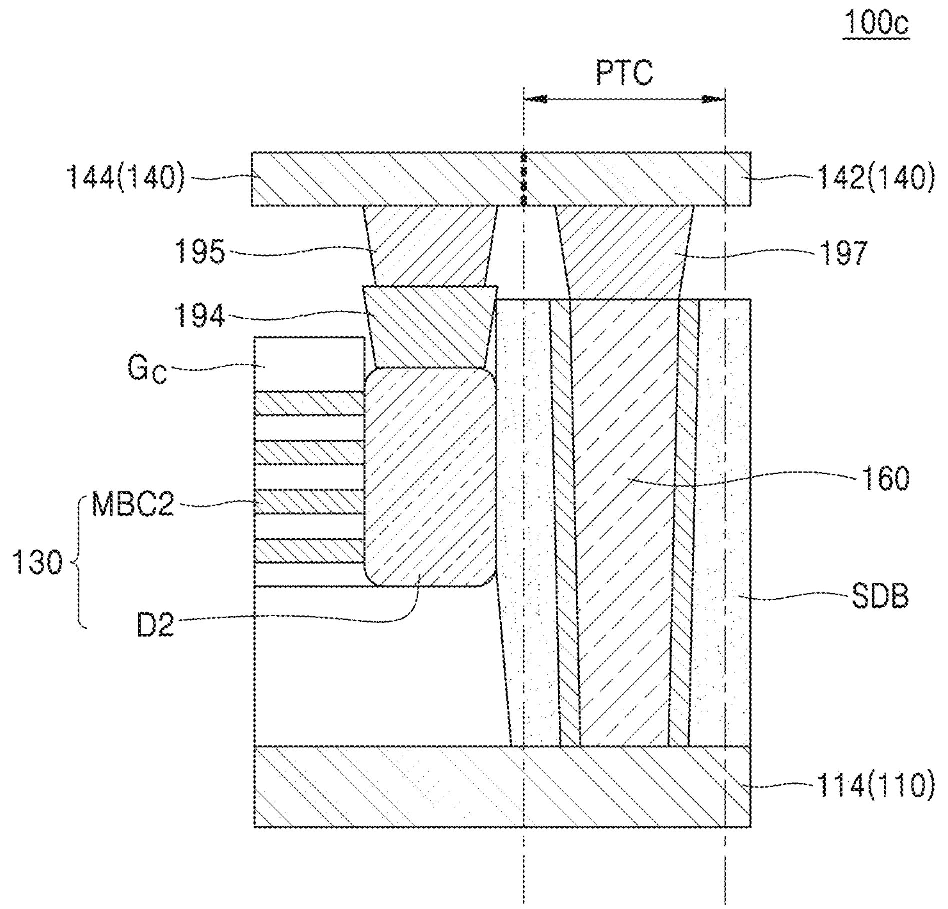
FIGS. 8A to 8C are cross-sectional views of a power tap cell portion of a 3D stacked FET according to embodiments of the inventive concept.
Figure 8B:
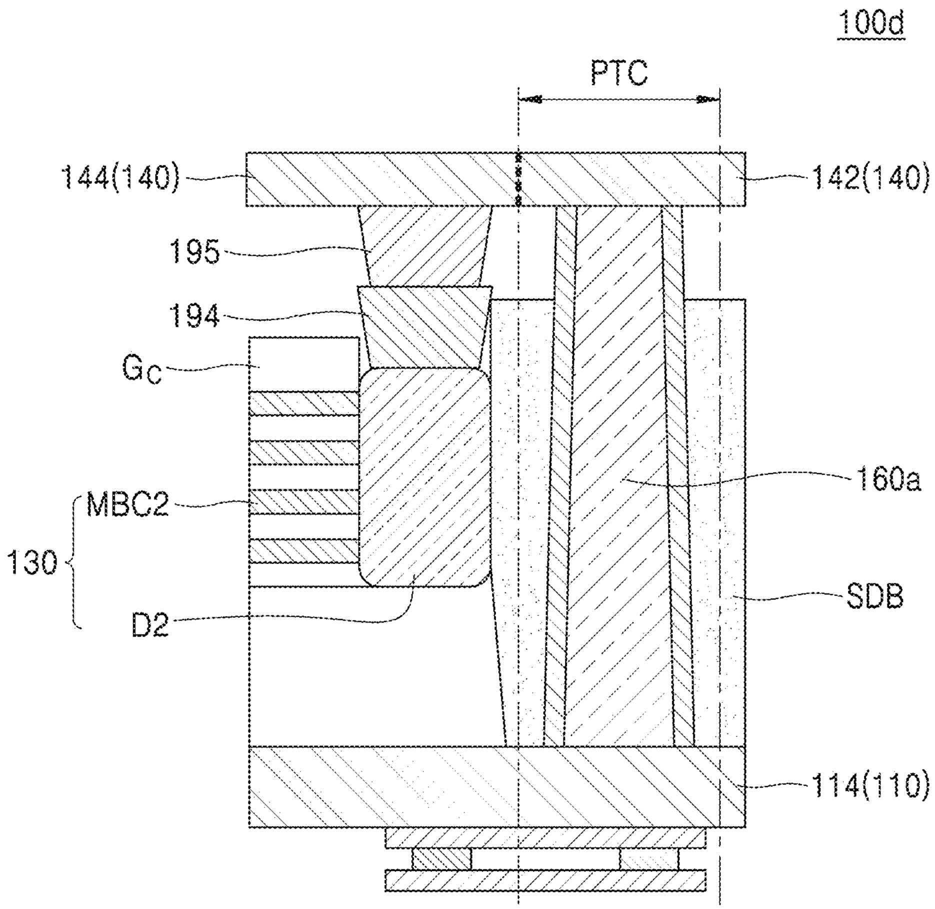
Figure 8C:
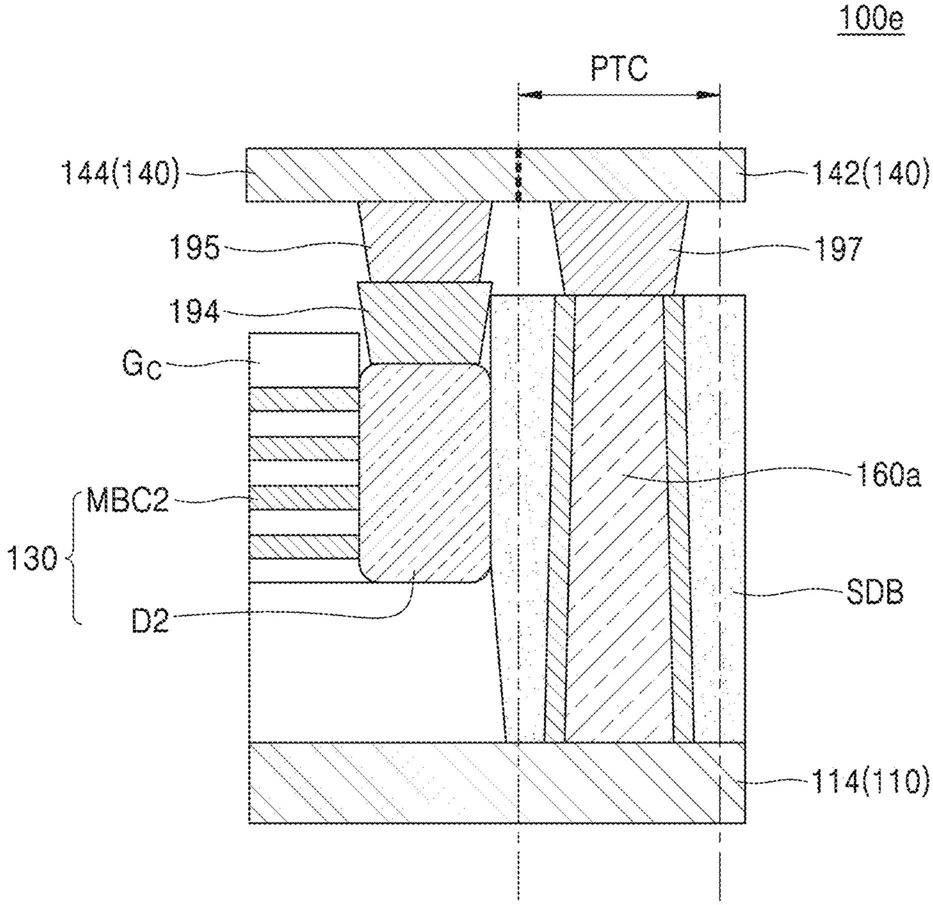

FIGS. 8A to 8C are cross-sectional views of a power tap cell portion of a 3D stacked FET according to embodiments of the inventive concept. The description is also given with reference to FIGS. 1, 4A, and 4B, and descriptions already given in the description of FIGS. 1 to 7*b* are briefly given or omitted.

Referring to FIG. 8A, in a 3D stacked FET 100*c* of this embodiment, a second through electrode 160 and a third power via 197 may be disposed in the power tap cell PTC. That is, the front-side power line 142 may be connected to the second back-side power line 114 through the third power via 197 and the second through electrode 160. Here, the second through electrode 160 may be a front-side through electrode. Accordingly, the upper side of the second through electrode 160 may have a wider width than the lower side of the second through electrode 160.

Referring to FIG. 8B, in a 3D stacked FET 100*d* of this embodiment, a second through electrode 160*a* may be disposed in the power tap cell PTC. That is, the front-side power line 142 may be connected to the second back-side power line 114 through the second through electrode 160*a*. Here, the second through electrode 160*a* may be a back-side through electrode. Accordingly, the width of the upper side of the second through electrode 160*a* may be narrower than that of the lower side of the second through electrode 160*a*.

Referring to FIG. 8C, in a 3D stacked FET 100*e* of this embodiment, a second through electrode 160*a* and a third power via 197 may be disposed in the power tap cell PTC. That is, the front-side power line 142 may be connected to the second back-side power line 114 through the third power via 197 and the second through electrode 160*a*. Here, the second through electrode 160*a* may be a back-side through electrode. Accordingly, the width of the upper side of the second through electrode 160*a* may be narrower than that of the lower side of the second through electrode 160*a*.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While embodiments of inventive concepts have been particularly shown and described with reference to embodiments thereof, it will be understood that various changes in form and details may be made therein without departing from the spirit and scope of the following claims.

What is claimed is:

1. A three dimensional ((3D) stacked Field Effect Transistor (FET) comprising:

a back-side wiring layer including a first back-side power line and a second back-side power line each extending in a first direction;

a first FET on the back-side wiring layer;

a second FET over the first FET;

a front-side wiring layer over the second FET, the front-side wiring layer extending in the first direction, and the front-side wiring layer including a front-side power line connected to the second back-side power line;

a first through-electrode connecting the first FET to the second FET; and a second through-electrode connecting the front-side power line to the second back-side power line, wherein the first FET and the second FET share a gate extending in a second direction, the second direction is perpendicular to the first direction, each of the first FET and the second FET include a source and a drain respectively on both sides of the gate in the first direction, and a channel between the source and the drain and surrounded by the gate, and the first through-electrode connects the source of the first FET to the drain of the second FET.

2. The 3D stacked FET of claim 1, wherein the channel has a Multi-Bridge Channel (MBC) structure, and wherein the gate has a gate all around (GAA) structure.

3. The 3D stacked FET of claim 1, further comprising:

a lower contact portion connecting the drain of the first FET to the first back-side power line, the drain of the first FET being a first drain and the drain of the second FET being a second drain;

an upper contact portion connecting the source of the second FET to the front-side power line, the source of the second FET being a second source and the source of the first FET being a first source;

a first source contact extending in the second direction and connecting the first source of the first FET to the first through-electrode; and a second drain contact extending in the second direction and connecting the second drain of the second FET to the first through-electrode.

4. The 3D stacked FET of claim 3, wherein the lower contact portion comprises a first drain contact and a first power via, the first drain contact extends in the second direction and is connected to the first drain of the first FET, the first power via connects the first drain contact to the first back-side power line, the upper contact portion comprises a second source contact and a second power via, the second source contact extends in the second direction and is connected to the second source of the second FET, and the second power via connects the second source contact to the front-side power line.

5. The 3D stacked FET of claim 4, wherein the second source contact and the front-side power line partially overlap each other in a third direction such that a portion of the second source contact is spaced apart from a portion of the front-side power line in the third direction, the third direction is perpendicular to the first direction and the second direction, and the second power via is between the portion of the second source contact and the portion of the front-side power line.

6. The 3D stacked FET of claim 4, wherein the first drain contact and the second source contact overlap in a third direction, the first source contact and the second drain contact overlap in the third direction, the first source contact is spaced apart from the first drain contact in the first direction, and the second source contact is spaced apart from the second drain contact in the first direction.

7. The 3D stacked FET of claim 1, wherein a conductivity type of the first FET differs from a conductivity type of the second FET, a position of the source of the first FET is opposite a position of the drain of the first FET in the first direction, a position of the source of the second FET is opposite a position of the drain of the second FET in the first direction, the first FET and the second FET are parts of an inverter in a unit cell of the 3D stacked FET, the unit cell is defined in the first direction by a region between up to ½ of each of two gates disposed on both sides of the gate in the first direction, and the unit cell is among a plurality of unit cells repeatedly arranged in the first direction.

8. The 3D stacked FET of claim 7, further comprising:

power tap cells connected to the plurality of unit cells, wherein the power tap cells are disposed for each set number of the plurality of unit cells in the first direction, and the second through-electrode is in a corresponding power tap cell among the power tap cells.

9. The 3D stacked FET of claim 8, wherein the corresponding power tap cell includes Single Diffusion Breaks (SDBs) extending in the second direction that are on both sides of the second through-electrode in the first direction.

10. The 3D stacked FET of claim 8, wherein the second through-electrode has a structure in which a front-side side is wide or a back-side side is wide, and the second through-electrode is directly connected to the front-side power line or the second through-electrode is connected to the front-side power line through a third power via.

11. A three dimensional (3D) stacked Field Effect Transistor (FET) comprising:

a back-side wiring layer including a first back-side power line and a second back-side power line each extending in a first direction;

a first FET on the back-side wiring layer;

a second FET over the first FET, a conductivity type of the second FET being different than a conductivity type of the first FET;

a front-side wiring layer over the second FET, the front-side wiring layer extending in the first direction and including a front-side power line connected to the second back-side power line;

a first through-electrode connecting the first FET to the second FET; and a second through-electrode connecting the front-side power line to the second back-side power line, wherein the first FET and the second FET share a first gate, the first FET and the second FET are in a unit cell of the 3D stacked FET, the unit cell corresponds to an area between up to one-half of each of two other gates on opposite sides of the first gate in the first direction and between the first back-side power line and the second back-side power line in a second direction, in the unit cell, the first gate is between the two other gates, the second direction is perpendicular to the first direction, the unit cell is among a plurality of unit cells repeatedly arranged in the first direction and the second direction, each of the first FET and the second FET comprises a source and a drain respectively on both sides of the first gate in the first direction, and a channel between the source and the drain, and the first through-electrode connects the source of the first FET to the drain of the second FET.

12. The 3D stacked FET of claim 11, wherein the first back-side power line and the second back-side power line are alternately disposed in the second direction, and the first through-electrode is at a position in the unit cell over the second back-side power line in the second direction.

13. The 3D stacked FET of claim 11, further comprising:

power tap cells connected to the plurality of unit cells, wherein the power tap cells are arranged for each unit cell of a set number of the plurality of unit cells in the first direction, and the second through-electrode is in a corresponding power tap cell among the power tap cells.

14. The 3D stacked FET of claim 11, wherein the channel of the first FET and the channel of the second FET have a Multi-Bridge Channel (MBC) structure, and the first gate has a gate all around (GAA) structure.

15. The 3D stacked FET of claim 11, further comprising:

a lower contact portion connecting a first drain of the first FET to the first back-side power line;

an upper contact portion connecting a second source of the second FET to the front-side power line; a first source contact extending in the second direction and connecting a first source of the first FET to the first through-electrode; and a second drain contact extending in the second direction and connecting a second drain of the second FET to the first through-electrode.

16. The 3D stacked FET of claim 15, wherein the lower contact portion comprises a first drain contact and a first power via, the first drain contact extends in the second direction and is connected to the first drain of the first FET, the first power via connects the first drain contact to the first back-side power line, the upper contact portion comprises a second source contact and a second power via, the second source contact extends in the second direction and is connected to the second source of the second FET, and the second power via connects the second source contact to the front-side power line.

17. The 3D stacked FET of claim 16, wherein the first drain contact and the second source contact overlap in a third direction, the first source contact and the second drain contact overlap in the third direction, the first source contact is spaced apart from the first drain contact in the first direction, and the second source contact is spaced apart from the second drain contact in the first direction.

18. A three dimensional (3D) stacked Field Effect Transistor (FET) comprising:

a back-side wiring layer including a first back-side power line and a second back-side power line each extending in a first direction;

a first FET on the back-side wiring layer;

a second FET over the first FET, a conductivity type of the second FET being different than a conductivity type of the first FET;

a front-side wiring layer over the second FET, the front-side wiring layer extending in the first direction, and the front-side wiring layer including a front-side power line connected to the second back-side power line;

a first through-electrode connecting the first FET to the second FET; and a second through-electrode connecting the front-side power line to the second back-side power line, wherein the first FET and the second FET share a first gate, the first FET and the second FET are in a unit cell of the 3D stacked FET, the unit cell corresponds to an area between up to one-half of each of two other gates on opposite sides of the first gate in the first direction and between the first back-side power line and the second back-side power line in a second direction, the second direction is perpendicular to the first direction, in the unit cell, the first gate is between the two other gates, each of the first FET and the second FET comprise a source and a drain respectively on both sides of the first gate in the first direction, and a channel between the source and the drain and surrounded by the first gate wherein the first through-electrode connects the source of the first FET to the drain of the second FET.

19. The 3D stacked FET of claim 18, further comprising:

power tap cells, wherein the first back-side power line and the second back-side power line are alternately disposed in the second direction, the first through-electrode is at a position in the unit cell over the second back-side power line in the second direction, the unit cell is among a plurality of unit cells, the power tap cells are arranged for each unit cell of a set number in the first direction among the plurality of unit cells, and the power tap cells each include the second through-electrode.

20. The 3D stacked FET of claim 18, further comprising:

a first drain contact extending in the second direction, the first drain contact being connected to the drain of the first FET, the drain of the first FET being a first drain and the drain of the second FET being a second drain;

a first power via connecting the first drain contact to the first back-side power line;

a second source contact extending in the second direction, the second source contact being connected to the source of the second FET, the source of the second FET being a second source and the source of the first FET being a first source;

a second power via connecting the second source contact to the front-side power line;

a first source contact extending in the second direction and connecting the first source of the first FET to the first through-electrode; and a second drain contact extending in the second direction and connecting the second drain of the second FET to the first through-electrode.

* * * * *